(12) United States Patent
Hsu et al.

(10) Patent No.: US 6,207,530 B1
(45) Date of Patent: Mar. 27, 2001

(54) DUAL GATE FET AND PROCESS

(75) Inventors: Louis Lu-Chen Hsu, Fishkill, NY (US); Li-Kong Wang, Montvale, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/100,900

(22) Filed: Jun. 19, 1998

(51) Int. Cl.[7] .................................................. H01L 21/76
(52) U.S. Cl. .......................... 438/404; 438/158; 438/164; 438/406
(58) Field of Search ............................... 438/39, 157, 158, 438/164, 404, 406, 435, 459, 588; 257/66

(56) References Cited

U.S. PATENT DOCUMENTS

| | | |
|---|---|---|
| 4,784,970 * | 11/1988 | Solomon ................................ 438/406 |
| 5,013,681 | 5/1991 | Godbey et al. . |
| 5,034,343 | 7/1991 | Rouse et al. . |
| 5,120,666 | 6/1992 | Gotou . |
| 5,188,973 | 2/1993 | Omura et al. . |
| 5,273,921 | 12/1993 | Neudeck et al. . |
| 5,296,727 | 3/1994 | Kawai et al. . |
| 5,376,559 * | 12/1994 | Mukai et al. ......................... 438/283 |
| 5,420,048 | 5/1995 | Kondo . |
| 5,436,173 * | 7/1995 | Houston ............................... 438/153 |
| 5,646,058 | 7/1997 | Taur et al. . |
| 5,702,963 | 12/1997 | Vu et al. . |
| 5,801,397 * | 9/1998 | Cunningham ......................... 257/66 |
| 6,004,837 * | 12/1999 | Gambino et al. ..................... 438/157 |

* cited by examiner

Primary Examiner—Stephen D. Meier
Assistant Examiner—Jeff Vockrodt
(74) Attorney, Agent, or Firm—Scully, Scott, Murphy & Presser; Casey P. August

(57) ABSTRACT

The present invention is directed to a method of fabricating a dual gate structure for use in FET devices wherein the dual gate structure comprises a bottom gate that is substantially a mirror image of the top gate. The method utilizes a shallow trench isolation process for the purpose of planarization and gate alignment. Also disclosed is a dual gate structure which is fabricated utilizing the method of the present invention.

26 Claims, 4 Drawing Sheets

DUAL GATE FET AND PROCESS

DESCRIPTION

1. Field of the Invention

The present invention relates to the fabrication of metal oxide semiconductor field effect transistor (MOSFET) devices, and in particular to a method of fabricating dual gate MOSFET devices wherein the top and bottom gates of the MOSFET devices are mirror images of each other. The present invention is also directed to MOSFET devices, and in particular to dual gate FET devices which comprise a top gate and a bottom gate that are substantially identical to each other, in terms of size, conductivity and uniformity of dopant throughout the two gate regions.

2. Background of the Invention

It is well known that a dual gate or double gate MOSFET device has several advantages over conventional single gate MOSFET devices. Specifically, the advantages for dual gate MOSFET devices over their single gate counterparts include: a higher transconductance, lower parasitic capacitance, and improved short-channel effects. For instance, Monte-Carlo simulation has been previously carried out on a 30 nm channel dual gate MOSFET device and has shown that the dual gate device has a very high transconductance (2300 mS/mm) and fast switching speeds (1.1 ps for nMOSFET). Moreover, improved short-channel characteristics are obtained down to 20 nm channel length with no doping needed in the channel region. This circumvents all the tunneling breakdown, dopant quantization, and dopant depletion problems associated with channel doping that are normally present with single gate MOSFET devices.

Despite these advantages, however, there is no satisfactory way of fabricating a dual gate structure wherein the bottom and top gates are mirror images of each other, i.e. they are substantially identical to each other in terms of conductivity, size and uniformity of dopant throughout the two gate regions. Previous efforts on fabricating dual gate MOSFETs generally fall into one of the following three categories:

(a) Etch silicon into a pillar structure and deposit gates around it.

(b) Make a conventional single-gate MOSFET, then use either selective epitaxy or bond-and-etch-back techniques to form the second gate.

(c) Start with a thin silicon-on-insulator (SOI) film, pattern a strip and dig a tunnel across it by etching the buried oxide. Then, deposit gate electrodes in the tunnel and on top of the SOI film.

There are serious drawbacks in all of the foregoing prior art approaches. For example, in (a), it is difficult to form a vertical pillar as thin as 10 nm with good thickness control and free of reactive ion etching (RIE) damage. In (b), it is difficult to keep the top and bottom oxides at the same thickness and to have the gates self-aligned to each other, and in (c), thickness control and top/bottom gate self-alignment are major problems.

Moreover, current prior art proposals to form the bottom gate of a dual gate MOSFET device are mostly done by ion implantation through a SOI structure. Several drawbacks using this approach also exist. These drawbacks include: ion implantation causes defects in device areas; the gate oxide quality of the bottom gate is poor; and the bottom gate is not isolated from the structure. Other known methods to form dual gate structures such as surround gate structures and 3-D devices are either too complicated or would consume too much of the surface area of the device. Thus, those methods are presently unsuitable for current dual gate FET device manufacturing.

In view of the drawbacks mentioned hereinabove with prior art methods for fabricating dual gate MOSFET devices, it would be beneficial if a new process was developed that is relatively simple, yet effective in fabricating dual gate devices which avoids the aforementioned shortcomings of the prior art.

SUMMARY OF THE INVENTION

One object of the present invention is to provide a method of fabricating a dual gate structure which contains a bottom gate and a top gate that are mirror images of each other (i.e. substantially identical, in terms of conductivity, size and uniformity of dopant throughout the two gate regions).

Another object of the present invention is to provide a method of fabricating a dual gate structure wherein the method provides the following advantages which are heretofore unobtainable utilizing prior art processes: the bottom gate has improved quality; the bottom gate is completely isolated from the substrate; no high energy ion implant is required; the top and bottom gates can be aligned easily and result in low overlap capacitance; and the device size is the same as that of a conventional single gate FET device.

These and other objects and advantages are achieved in the present invention by utilizing a novel shallow trench isolation process which is used in the present invention for polishing and alignment purposes. Specifically, the method of the present invention, which forms a dual gate structure wherein the top gate and bottom gate are mirror images of each other, comprises the steps of:

(a) providing a structure comprising a first oxide layer formed over a silicon substrate, wherein said first oxide layer contains a first gate region embedded therein and said silicon substrate contains two regions each of which comprises a bottom nitride layer and a top oxide layer formed between said first gate region;

(b) bonding an exposed surface of said first oxide layer to a handling wafer;

(c) polishing away a portion of said silicon substrate stopping at said bottom nitride layer;

(d) removing said nitride layer from said polished silicon substrate;

(e) growing an oxide region in and on said polished silicon substrate provided in step (d);

(f) forming a protective layer over said structure provided in step (e);

(g) opening a hole in the structure extending down to said first gate region;

(h) depositing a layer of polysilicon over the structure provided in step (g) including in said hole;

(i) patterning the polysilicon layer and developing the pattern so as to provide a second gate region directly over the underlying first gate region;

(j) implanting source and drain regions in said silicon substrate adjacent to said first and second gate regions; and (k) annealing the structure provided in step (j).

It is noted that the terminology "first gate region" refers to the bottom gate region of the MOSFET device and "second gate region" refers to the top gate region of the MOSFET device.

Another aspect of the present invention relates to a dual gate structure which comprises a top gate electrode and a bottom gate electrode, wherein said top gate electrode is a mirror image of the bottom gate electrode and they are substantially identical to each other in terms of conductivity, size and uniformity of dopant concentration.

DETAILED DESCRIPTION OF THE INVENTION

Figure 1:
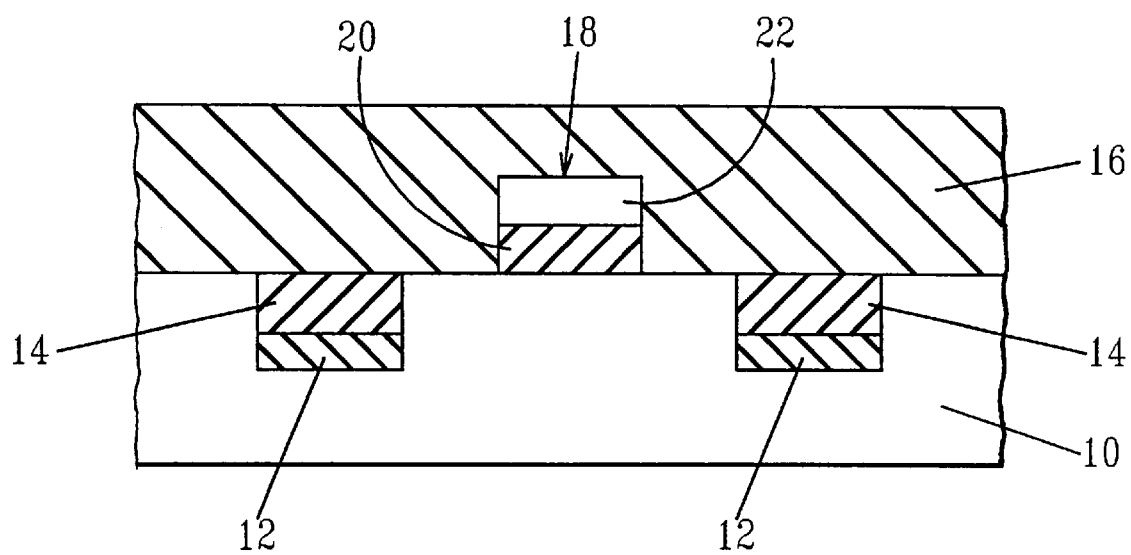
FIG. 1 is a cross-sectional view showing the initial structure which is employed in step (a) of the present invention.

The present invention, which relates to a method of fabricating a dual gate structure, will now be described in greater detail by referring to the drawings that accompany this specification. It should be noted that in the drawings like elements or components are referred to with like or corresponding reference numerals.

Referring to the drawings in more detail, and in particular to FIGS. 1–4, there are shown the various processing steps that are employed in the present invention for fabricating a dual gate structure wherein the top and bottom gates are functionally and structurally identical to each other, i.e. the top and bottom gates are mirror images of each other.

Specifically, FIG. 1 shows a cross-sectional view of the initial structure that is employed in the present invention in step (a) mentioned above. The structure shown in FIG. 1 comprises a silicon substrate 10 having a first oxide layer 16 formed over one of its surfaces. First oxide layer 16 is depicted as containing a first gate region 18 that comprises a polysilicon layer 22 formed on top of a gate oxide layer 20. The silicon substrate contains the following two regions: a bottom nitride layer 12 and a top oxide layer 14 which are formed in the surface of silicon substrate 10 and positioned between the first gate region 18. It is noted that first gate region 18 and the two regions in silicon substrate 10 are present at the interface between first oxide layer 16 and silicon substrate 10.

The structure shown in FIG. 1 is formed utilizing conventional techniques well known to those skilled in the art. For example, the structure of FIG. 1 can be formed as follows: First, trenches are formed in the surface of a silicon substrate 10 utilizing standard lithography and etching such as reactive ion etching (RIE). After trench formation, a layer of nitride 12 is formed in the bottom of the trenches using a directional chemical vapor deposition (CVD) technique which is highly selective in depositing nitride layer 12 on the bottom of the trenches. Typically, the conditions employed in the directional CVD deposition are sufficient to form a nitride layer that has a thickness on the bottom of the trench of from about 10 to about 500 nm. More preferably, the deposition conditions are sufficient to provide a nitride layer that has a thickness of from about 20 to about 200 nm. It is noted that nitride layer 12 serves two functions in the present invention. First, it acts as a polish stop layer and secondly, it acts as a sacrificial layer.

Next, an oxide layer, i.e. layer 14 in FIG. 1, is formed over nitride layer 12 using conventional deposition techniques such as CVD, sputtering and plasma deposition. This initial structure is then planarized using standard planarization techniques including, but not limited to: chemical-mechanical polishing (CMP) or mechanical grinding. After planarizing the silicon substrate, first gate region 18 is formed on the surface of silicon substrate 10 between the two filled trench regions containing nitride layer 12 and oxide layer 14 using standard techniques which are well known to those skilled in the art for forming such regions. Specifically, first gate region 18 is formed by patterning the silicon substrate in a desired pattern; growing epitaxial silicon on the unpatterned area; doping regions of the grown epitaxial silicon; oxidizing the doped silicon regions; depositing a polysilicon layer over said oxide region and stripping the material used in forming the patterning.

After formation of first gate region 18, a layer of first oxide 16 is formed over the structure utilizing conventional deposition techniques such as CVD which are capable of providing a thick oxide layer having a thickness of from about 100 to about 2000 nm. More preferably, the thickness of first oxide layer 16 is from about 300 to about 1000 nm.

It is again emphasized that the above provides a description on how to manufacture the initial structure shown in FIG. 1. The exact conditions and techniques used in forming this structure are well known to those skilled in the art.

In accordance with the method of the present invention, the structure shown in FIG. 1, particularly the exposed outer surface of first oxide region 16 is bonded to a handling wafer. The handling wafer, which is referenced in FIG. 2 as element 24, is any conventional semiconductor wafer including but not limited to: Si, Ge, GaP, InAs, InP, SiGe, GaAs or other III/V compounds. Of these materials, it is preferred that handling wafer 24 be composed of Si.

Handling wafer 24 is bonded to the exposed surface of first oxide layer 16 using conventional bonding techniques well known to those skilled in the art. For example, the bonding of the handling wafer may be accomplished by bonding and annealing.

Figure 2A:
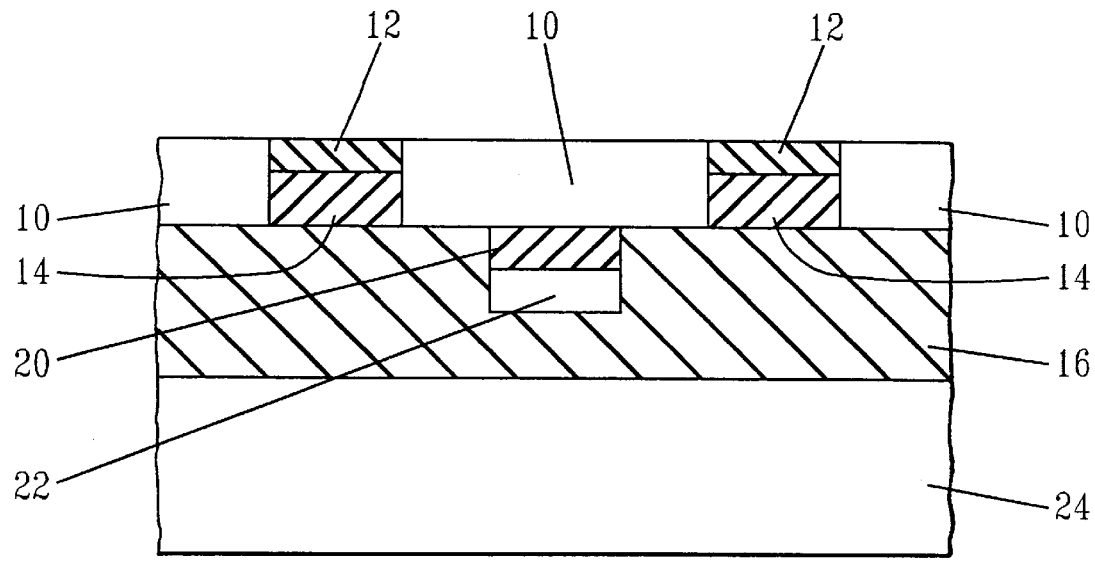
FIGS. 2(a)–(b) are cross-sectional views of the structure of FIG. 1 shown along (a) the vertical, i.e. y–y', directional axis and (b) the horizontal, i.e. x–x', direction after conducting steps (b) and (c) of the present invention.
Figure 2B:
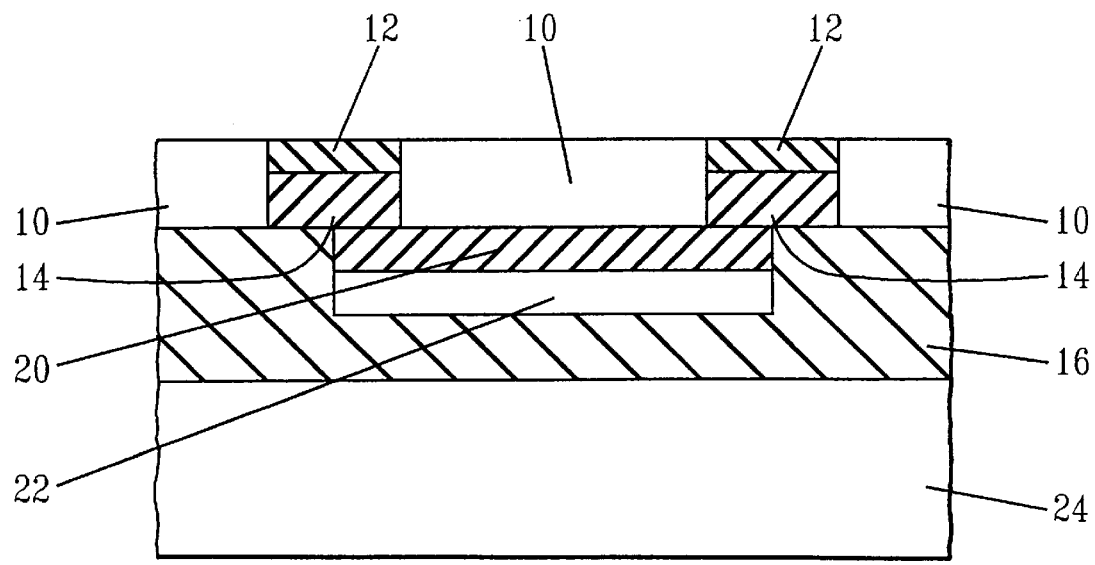

After, bonding the structure of FIG. 1 to handling wafer 24, the structure is rotated 180 degrees (see FIGS. 2(a)–(b)) and a portion of silicon substrate 10 is removed stopping at bottom nitride layer 12 which serves as a polish stop layer and a sacrificial layer in the present application. Portions of silicon substrate 10 are removed in the present invention by utilizing standard polishing techniques that are well known to those skilled in the art. For example, chemical mechanical polishing (CMP) or mechanical grinding can be employed to remove a portion of silicon substrate 10. The grinded structure containing handling wafer 24 is shown in FIGS. 2(a)–(b).

Figure 3A:
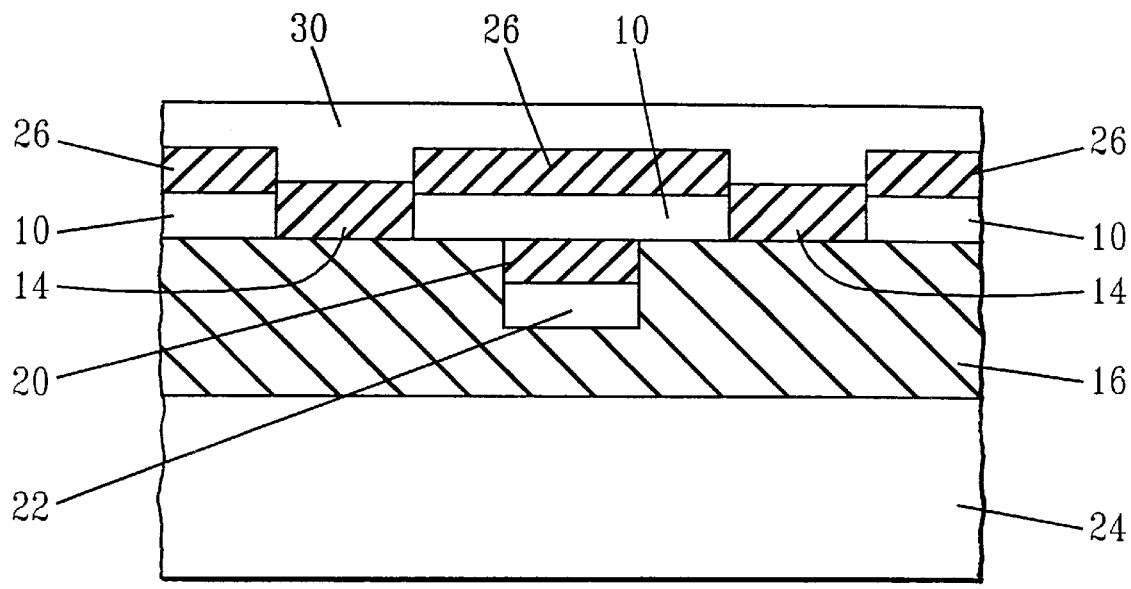
FIGS. 3(a)–(b) are cross-sectional views of the structure of FIG. 2 shown along (a) the vertical, i.e. Y–Y', directional axis and (b) the horizontal, i.e. x–x', direction after conducting steps (d) and (e) of the present invention.
Figure 3B:
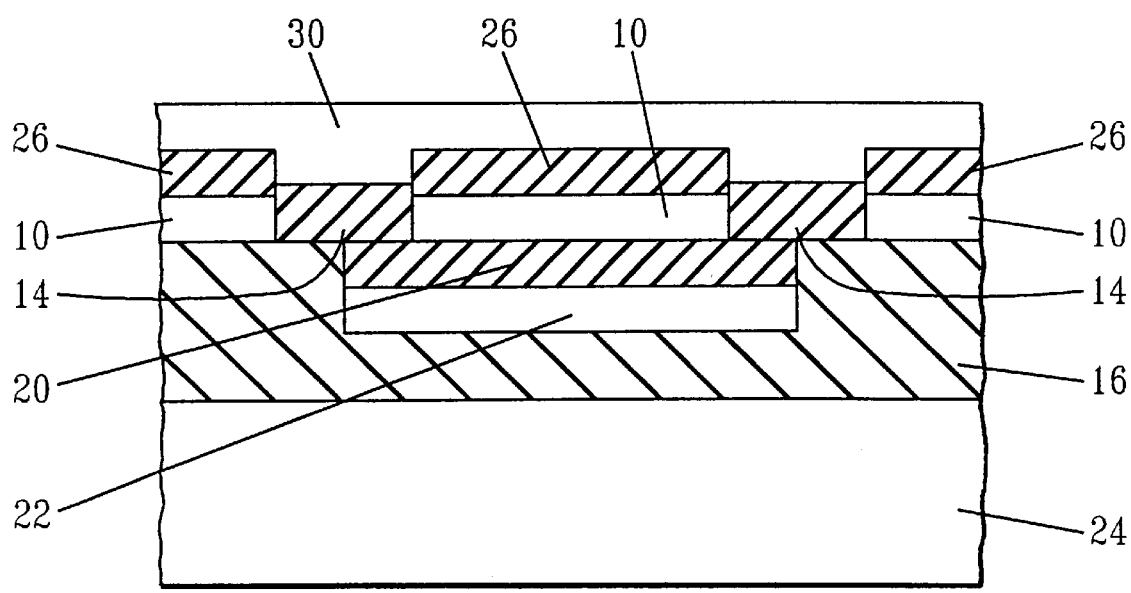

Reference is now made to FIGS. 3(a)–(b) which shows the structure which is obtained after conducting the following steps of the present invention. After removing a portion of silicon substrate 10 by polishing, bottom nitride layer 12 is removed using an anisotropic etching process such as RIE or plasma etching which is highly selective in removing bottom nitride layer 12.

Next, an oxide layer is then grown on and in the surface of the exposed regions of silicon substrate 10 forming oxide regions 26 using conventional growing techniques such as thermal oxidation or deposition.

A protective layer of polysilicon 30 is then formed on the structure utilizing deposition techniques such as CVD, spin-coating, plasma CVD and other like deposition techniques. Protective layer 30 typically has a thickness of from about 10 to about 200 nm. More preferably, protective layer 30 is deposited under deposition conditions which are effective in forming a layer that has a thickness of from about 20 to about 100 nm.

Figure 4A:
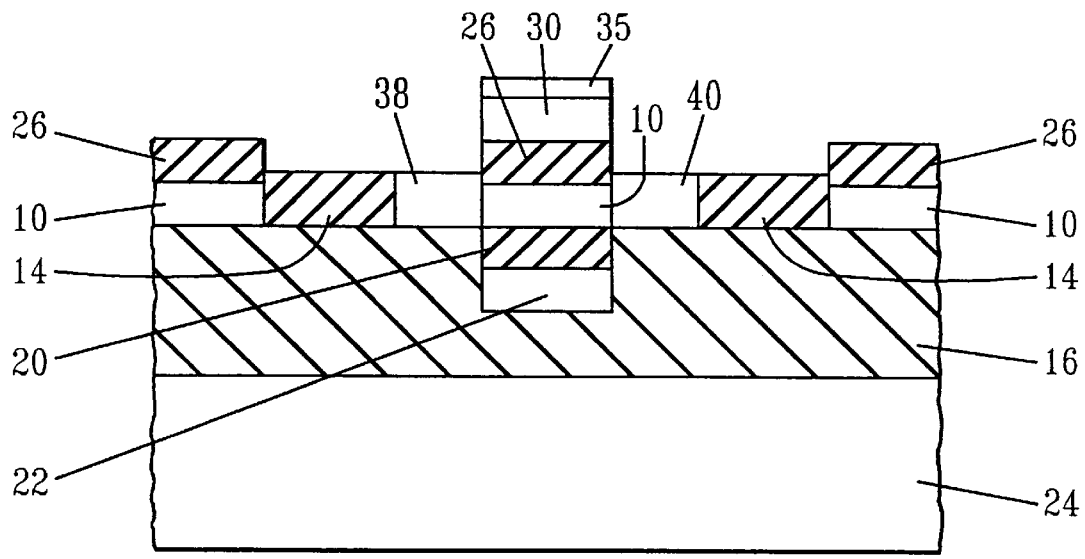
FIGS. 4(a)–(b) are cross-sectional views of the structure of FIG. 3 shown along (a) the vertical, i.e. y–y', directional axis and (b) the horizontal, i.e. x–x', direction after conducting steps (f)–(k) of the present invention.
Figure 4B:
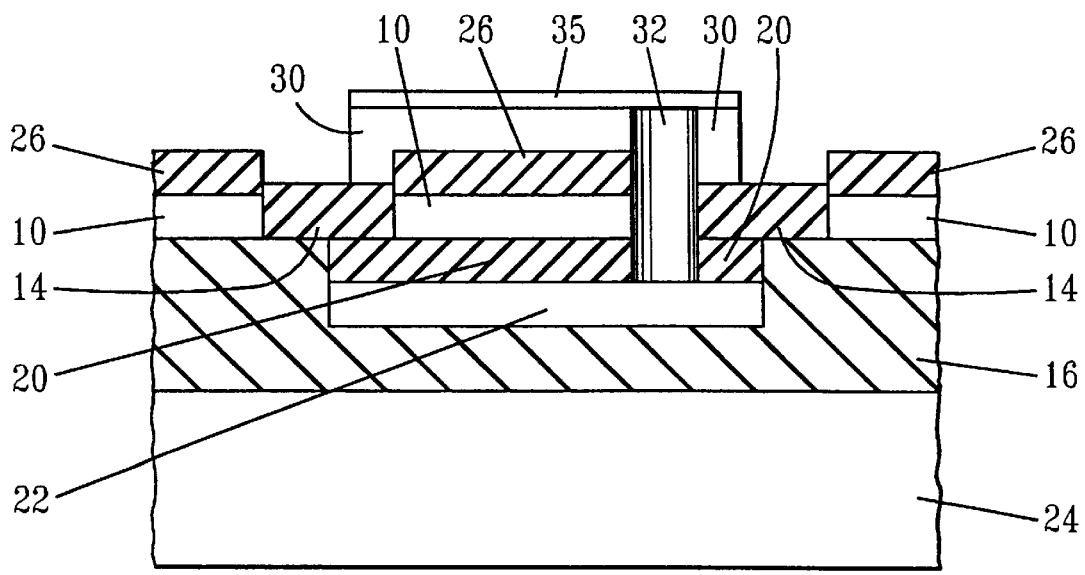

A contact hole such as shown in FIG. 4(b) is then formed in the surface of the structure extending down through layers 26, 14 and 20 so as to expose polysilicon layer 22 formed in first oxide layer 16. The contact hole, which is labeled as 32 in FIG. 4(b), is formed utilizing standard lithography including, patterning the structure and etching the expose, i.e. unpatterned area, of protective layer 30. The contact hole is needed in the present invention to provide an electrical contact between the top and bottom gate regions.

An outer layer of polysilicon 35 is then formed over the surface of protective layer 30 and into contact hole 32 utilizing the same deposition techniques used in forming protective layer 30. Typically, the outer layer is deposited under suitable deposition conditions that are effective in forming a polysilicon layer that has a thickness of from about 50 to about 400 nm. More preferably, the outer polysilicon layer has a thickness of from about 100 to about 300 nm.

The top gate which is designated as 30 in FIGS. 4(a)–(b) is then patterned utilizing standard lithography techniques and etching, and then source region 38 and drain region 40 are formed by implanting a suitable source-drain dopant ion (e.g. arsenic for n-the channel; and boron for the p-channel) into silicon regions 10 that are adjacent to the top and bottom gate electrodes. A conventional ion implantation apparatus that operates at energies of from about 1 to about 200 KeV is employed in forming the source/drain regions. More preferably, the ion implantation step is carried out at an energy of from about 10 to about 100 KeV. The dosage, i.e. concentration, of the dopant ion implanted in this step of the present invention is typically of from about $1 \times 10^{14}$ to about $1 \times 10^{16}/cm^2$. More preferably, the ion dose used in the implantation step is from about $1 \times 10^{14}$ to about $1 \times 10^{15}/cm^2$. Additionally, the implantation step is carried out at a temperature of from about 0° to about 200° C.

After implanting the appropriate ions to form the source/drain regions in the structure, the structure is then subjected to annealing which is conducted in an inert gas atmosphere such as helium, nitrogen or argon. Specifically, annealing of the structure is carried out at a temperature of from about 600° to about 1200° C. for a time period of from about 10 seconds to about 60 minutes. More specifically, annealing of the structure is conducted at a temperature of from about 900° to about 1100° C. for a time period of from about 10 seconds to about 5 minutes. The annealing may be conducted at a set temperature or it can be ramped up to a desired temperature utilizing a number of ramp cycles and soak cycles.

It is emphasized that FIGS. 4(a)–(b) show the final dual gate structure which is obtained in the present invention. As is shown, top gate 30 and bottom gate 22 which are both composed of polysilicon are identical to each in terms of size and they are selfaligned. Moreover, both gate regions have identical conductivity.

The above description provides a unique method of fabricating a dual gate structure which is heretofore unknown. Moreover, the above described method improves the quality and the performance of any MOSFET device fabricated therefrom since the method of the present invention is capable of providing improved gate oxide quality for both the top and bottom gates which exhibit less overlap capacitance than prior art dual gate structures.

While the invention has been particularly shown and described with respect to preferred embodiments thereof, it will be understood by those skilled in the art that the foregoing and other changes in form and details may be made therein without departing from the spirit and scope of the present invention.

What is claimed is:

1. A method of fabricating a dual gate structure comprising:
   (a) providing a structure having a first oxide layer formed over a silicon substrate, wherein said first oxide layer contains a first gate region embedded therein and said silicon substrate contains two regions comprising a bottom nitride layer and a top oxide layer formed between said first gate region;
   (b) bonding an exposed surface of said oxide layer to a handling wafer;
   (c) polishing away a portion of said silicon substrate stopping at said bottom nitride layer;
   (d) removing said nitride layer from said polished silicon substrate;
   (e) growing oxide regions in said polished silicon substrate provided in step (d);
   (f) forming a protective layer of polysilicon over said polished silicon substrate provided in step (e);
   (g) opening a hole through at least a portion of said protective layer, said oxide region, said top oxide layer and said first oxide layer extending down to said first gate region;
   (h) depositing an outer layer of polysilicon over said protective layer and in said hole;
   (i) patterning the polysilicon layer and protective layer and developing the pattern so as to provide a second gate region directly over the underlying first gate region;
   (j) implanting source and drain regions in said silicon substrate adjacent to said second gate region; and
   (k) annealing the structure provided in step (j).

2. The method of claim 1 wherein first gate region includes a patterned oxide region and a patterned polysilicon region.

3. The method of claim 1 wherein said bottom nitride layer is formed utilizing directional chemical vapor deposition (CVD).

4. The method of claim 1 wherein said bottom nitride layer has a thickness of from about 10 to about 500 nm.

5. The method of claim 4 wherein said bottom nitride layer has a thickness of from about 20 to about 200 nm.

6. The method of claim 1 wherein said handling wafer is a semiconductor wafer selected from the group consisting of Si, Ge, GaP, InAs, InP, SiGe, GaAs and other III/V compounds.

7. The method of claim 6 wherein said handling wafer is Si.

8. The method of claim 1 wherein said bonding step is carried out by bonding and annealing.

9. The method of claim 1 wherein prior to conducting step (c) the bonded structure is rotated 180°.

10. The method of claim 1 wherein said polishing step is carried out by chemical mechanical polishing (CMP) or mechanical grinding.

11. The method of claim 1 wherein step (d) is carried out using an anisotropic etching process selected from the group consisting of reactive ion etching (RIE) and plasma etching.

12. The method of claim 1 wherein said oxide regions are grown by thermal oxidation or deposition.

13. The method of claim 1 wherein step (f) is carried out by a deposition process selected from the group consisting of CVD, spin-coating, and plasma CVD.

14. The method of claim 1 wherein said protective layer of polysilicon has a thickness of from about 10 to about 200 nm.

15. The method of claim 14 wherein said protective layer of polysilicon has a thickness of from about 20 to about 100 nm.

16. The method of claim 1 wherein said contact hole is formed by lithography and etching.

17. The method of claim 1 wherein said outer layer of polysilicon is formed by a deposition process selected from the group consisting of CVD, spin-coating, and plasma CVD.

18. The method of claim 1 wherein said outer layer of polysilicon has a thickness of from about 50 to about 400 nm.

19. The method of claim 18 wherein said outer layer of polysilicon has a thickness of from about 100 to about 300 nm.

20. The method of claim 1 wherein step (j) is carried out using an ion implantation apparatus that operates at energies of from about 1 to about 200 KeV.

21. The method of claim 20 wherein step (j) is carried out using an ion implantation apparatus that operates at energies of from about 10 to about 100 KeV.

22. The method of claim 1 wherein step (j) employs a source-drain dopant ion which has a concentration of from about $1 \times 10^{14}$ to about $1 \times 10^{16}/cm^2$.

23. The method of claim 22 wherein step (j) employs a source-drain dopant ion which has a concentration of from about $1 \times 10^{14}$ to about $1 \times 10^{15}/cm^2$.

24. The method of claim 1 wherein step (k) is conducted in an inert gas atmosphere.

25. The method of claim 1 wherein step (k) is carried out at a temperature of from about 600° to about 1200° C. for a time period of from about 10 seconds to about 60 minutes.

26. The method of claim 25 wherein step (k) is carried out at a temperature of from about 900° to about 1110° C. for a time period of from about 10 seconds to about 5 minutes.

* * * * *